(12) United States Patent
Deng

(10) Patent No.: US 6,486,707 B1
(45) Date of Patent: Nov. 26, 2002

(54) CMOS PASS TRANSISTOR LOGIC CIRCUITRY USING QUANTUM MECHANICAL TUNNELING STRUCTURES

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/617,574

(22) Filed: Jul. 17, 2000

Related U.S. Application Data

(60) Provisional application No. 60/144,124, filed on Jul. 16, 1999.

(51) Int. Cl.[7] ............................................. H03K 19/094
(52) U.S. Cl. ..................... 326/113; 326/132; 326/134; 326/135; 377/128; 327/196
(58) Field of Search .................. 326/113, 132, 326/134, 135; 377/128; 327/192, 195, 196, 397, 498, 499, 500

(56) References Cited

U.S. PATENT DOCUMENTS

| | | | | | |
|---|---|---|---|---|---|
| 3,218,466 A | * | 11/1965 | Walsh et al. | ................. | 326/132 |
| 5,477,169 A | * | 12/1995 | Shen et al. | .................... | 326/55 |
| 5,903,170 A | * | 5/1999 | Kulkarni et al. | ............ | 326/134 |
| 5,930,323 A | * | 7/1999 | Tang et al. | .................... | 377/77 |

\* cited by examiner

*Primary Examiner*—Tuan T. Lam
(74) *Attorney, Agent, or Firm*—Mark Courtney; W. James Brady; Frederick J. Telecky, Jr.

(57) ABSTRACT

CMOS semiconductor pass-transistor logic circuitry (200) is disclosed, comprising pass transistor circuitry (204, 212, 218), and tunneling structure circuitry (228) coupled to the pass transistor circuitry; where the tunneling structure circuitry is adapted to hold a node (222) voltage stable by compensating a leakage current (302) originating from said pass transistor circuitry.

12 Claims, 1 Drawing Sheet

CMOS PASS TRANSISTOR LOGIC CIRCUITRY USING QUANTUM MECHANICAL TUNNELING STRUCTURES

This application claims priority under 35 USC §119 (e) (1) of Provisional Application No. 60/144,124, filed Jul. 16, 1999.

TECHNICAL FIELD OF THE INVENTION

The present invention relates, in general, to logic circuitry used in electronic devices, and in particular, to pass transistor logic circuitry designed for a Complementary Metal Oxide Semiconductor (CMOS) process including quantum mechanical tunneling structures.

BACKGROUND OF THE INVENTION

The continual demand for enhanced transistor and integrated circuit performance has resulted in improvements in existing devices, such as silicon, bipolar, and CMOS transistors and Galium Arsenide (GaAs) transistors, and also in the introduction of new device types and materials. In particular, scaling down device sizes to enhance high frequency performance leads to observable quantum mechanical effects, such as carrier tunneling through potential barriers. These effects led to development of alternative device structures which take advantage of such tunneling phenomenon; such as tunneling, and resonant tunneling, diodes and transistors. For ease of reference, all such structures are hereafter collectively referred to as tunneling diodes (TDs).

Tunneling diodes are generally two terminal devices with conduction carriers tunneling through potential barriers to yield current-voltage curves with portions exhibiting negative differential resistance (NDR). This negative differential resistance characteristic has been used as the basis for a wide range of high performance designs.

Conventionally, tunneling and resonant tunneling diodes have been limited in implementation to GaAs and other high performance processes. Conventional methods have focused on building TDs in GaAs for several reasons; mainly because the speed characteristics and small process features of GaAs processes were conducive to tunneling mechanics. However, performance considerations such as difficulty controlling peak current in TDs, limited their practical application and use. Additionally, since GaAs processes were not practical or cost efficient for high-volume, consumer-related production, TDs were generally limited in application to research and developmental applications.

Previously, the feature size of standard silicon processes, such as CMOS, was not conducive to producing such tunneling structures. Other conventional methods of utilizing tunneling structures in conjunction with standard silicon processes entailed fabrication of a TD structure in a non-silicon process, followed by transferring and bonding (or electrically coupling) the TD structure to a host silicon substrate. While certain performance issues may have thus been addressed, such a process required extra design time and processing steps. The additional design and fabrication costs associated with these approaches is therefore not commercially viable for large volume logic device production.

Thus, conventional implementations of tunneling structures have been used only in discrete form and niche applications, such as high speed pulse and edge generation; produced in costly, high-performance processes. Limitations to conventional tunneling structures include the difficulty in controlling peak current and the lack of an integrated circuit process capable of commercially producing tunneling structures in a commercially viable format.

In the absence of commercially viable TDs, conventional CMOS logic circuit designs have utilized functional components readily available in the CMOS process, such as inverters and logic and transmission gates. Conventional methods have focused on optimizing the design of these components individually, and improving their efficiency when utilized within larger circuits. Such conventional methods inevitably yield device inefficiency; due mainly to layout area, power consumption, and operational speed limits resulting from standard CMOS components.

As performance demands have increased and feature sizes for CMOS processes have decreased, fabrication of tunneling structures in a production CMOS process becomes feasible. Tunnel diode growth on silicon is relatively immature. Recently, CMOS compatible tunnel diodes have been demonstrated to show that a wide range of current densities can be obtained; addressing requirements for imbedded memory and signal processing applications.

Therefore, a system of logic circuitry designs incorporating tunneling structures for a CMOS process is now needed; providing enhanced design performance and efficiency while overcoming the aforementioned limitations of conventional methods.

SUMMARY OF THE INVENTION

Pass-transistor logic (PTL), being more compact than other CMOS logic implementations, has been widely used in applications that demand high-speed, high-density, and low-power. PTL is typically employed to provide connectivity between large functional blocks of circuitry, and is especially useful in fast multiplication applications. As such, PTL dominates the design of adders, multipliers, ALU's, signal processing units, and circuitry performing Boolean operations. It is widely used in address decoders and read circuits for memories; as well as control circuitry.

In the present invention, PTL circuitry is designed for a CMOS process including quantum mechanical tunneling structures; providing circuit layout area, power consumption, and operational speed advantages over conventional methods. NDR and current-voltage (I–V) characteristics of tunneling structures are exploited to provide high-performance, high functionality logic circuitry. Tunneling structures are utilized, replacing conventional CMOS components, to address MOS leakage and hold data state in a PTL circuit.

In one embodiment of the present invention, a pass-transistor network is designed, incorporating a tunneling diode, to implement a Boolean operation. The tunneling diode replaces a number of components used in conventional designs, providing high system performance with optimum design overhead.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention defines logic circuitry employing tunneling structures in a homogenous silicon process; providing increased performance and design optimization. The present invention provides reduced circuit complexity for pass-transistor logic (PTL) circuits; decreasing the number of circuit components used, the number of interconnects, and the number of delay stages. The present invention thus realizes a significant reduction in layout area, operation delay, and power consumption over conventional methods. NDR and current-voltage (I–V) characteristics of tunneling structures are exploited to provide high-performance, high functionality logic circuitry.

For purposes of illustration, pass-transistor network circuitry utilizing resonant tunneling diodes (RTDs) is provided. However, the principles and applications of the present invention are applicable to resonant tunneling diodes as well as Esaki ($p^+n^+$) diodes; hereafter collectively referred to as tunneling diodes (TDs). TDs are desirable for use in high speed logic circuit applications due to the fact that their switching speed is generally faster than standard MOS structures. TDs are well-known for their intrinsic bi-stability and high-speed switching capability due to their negative differential resistance (NDR) characteristic. High current density, low capacitance, and the NDR of TDs make them lo very fast non-linear circuit elements. These same device characteristics can be exploited in high-speed, low-power, digital logic circuits. Thus, in most general purpose applications, where a large fraction of the circuits may be idle at any given time, the present invention provides a significant advantage over conventional methods because CMOS structures have lower tunnel power dissipation due to very low static power consumption.

Figure 1:
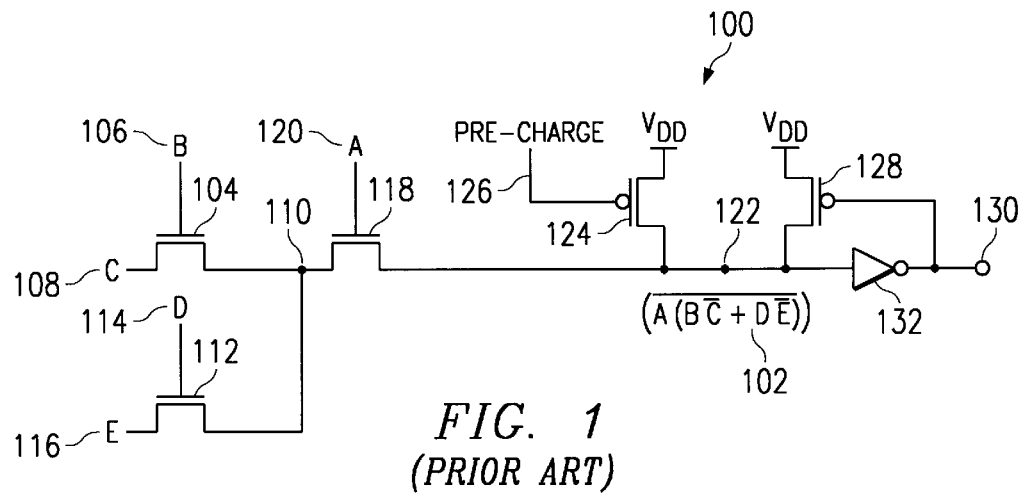
FIG. 1 is a schematic of a prior art CMOS pass-transistor network circuit.

Referring now to FIG. 1, a schematic representative of a prior art pass-transistor logic circuit 100 is shown. Circuit 100 implements the Boolean condition 102 shown with the circuit.

Pass transistor 104 has base input 106, representing "B", and input 108, representing "C", at one end. Transistor 104 couples at its other end to node 110. Similarly, pass transistor 112 has base input 114, representing "D", input 116, representing "E", at one end, and is coupled at its other end to node 110. Pass transistor 118 has base input 120, representing "A", and couples at one end to node 110 and at its other end to node 122.

Transistor 124 is coupled at one end to node 122; having its other end coupled to $V_{DD}$ and its base 126 coupled to a pre-charge voltage. Similarly, transistor 128 is coupled at one end to node 122 and its other end to $V_{DD}$; having its base coupled to node 130. Additionally, inverter 132 is coupled between nodes 122 and 130.

In operation, node 130 is pre-charged, via transistor 124, to a high voltage level "1". If condition 102 is satisfied, node 130 will transition low to a "0" level. Due to MOS leakage current associated with transistors 104, 112, and 118, however, node 130 may transition erroneously. Transistor 128 and inverter 132 effectively form a loop used to address MOS leakage current effects on the node 130 voltage.

Figure 2:
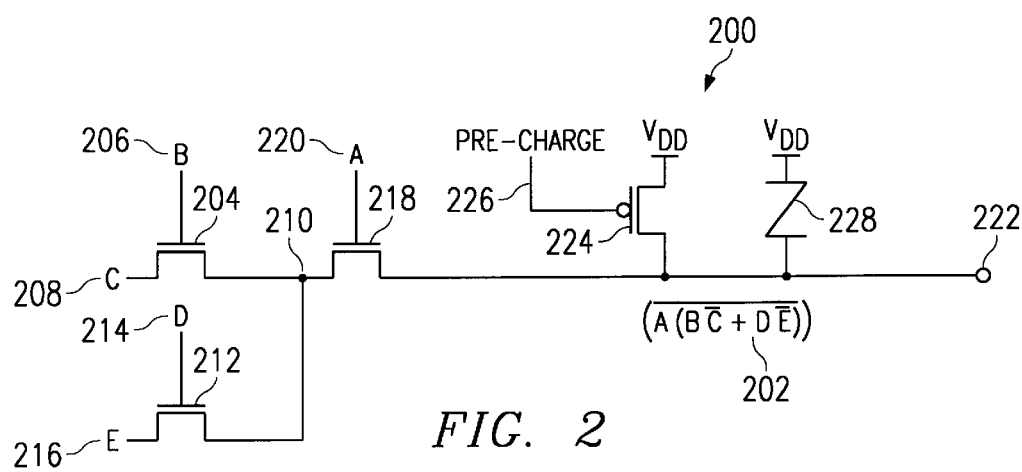
FIG. 2 is a schematic of a CMOS pass-transistor network circuit incorporating a tunneling diode according to the present invention.

In contrast, FIG. 2 illustrates a pass-transistor logic circuit 200 according to the present invention. Circuit 200 implements Boolean condition 202. Pass transistor 204 is an nMOS transistor having base input 206, representing "B", and input 208, representing "C", at one end. Transistor 204 couples at its other end to node 210. Similarly, pass transistor 212 has base input 214, representing "D", input 216, representing "E", at one end, and couples at its other end to node 210. Pass transistor 218 has base input 220, representing "A", and couples at one end to node 210 and at its other end to node 222. Node 222 provides- the output for circuit 200; the evaluation of condition 202. Pre-charge transistor 224 is a pMOS transistor, coupling one end to node 222, coupling at its other end to $V_{DD}$ and at its base 226 to a pre-charge voltage. Tunneling diode (TD) 228 couples at one end to node 222 and its other end to $V_{DD}$.

In operation, node 222 is pre-charged, via transistor 224, to a high voltage level "1". If condition 202 is satisfied, node 222 will discharge to a low ("0") level through transistors 204, 212, and 218. If condition 202 is not satisfied, node 222 should remain at a high level. Due to MOS leakage currents associated with transistors 204, 212, and 218, however, node 222 may transition erroneously. TD 228 provides a state hold functionality, however, compensating for these leakage currents. Thus, node 222 voltage level remains stable and TD 228 provides a high reliability system.

Figure 3:
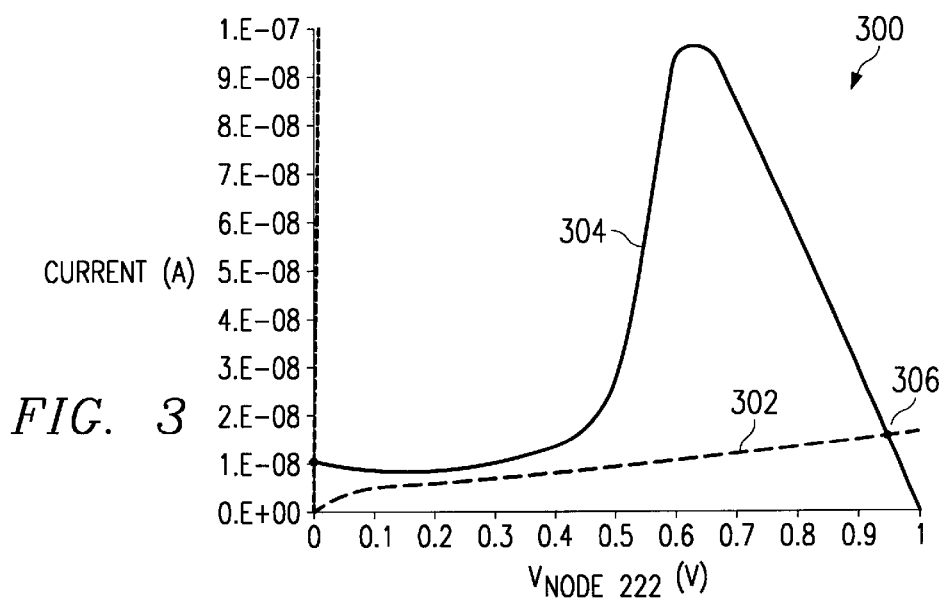
FIG. 3 is a graph illustrating characteristics of the circuit of FIG. 2.

FIG. 3 illustrates one advantage of the present invention. A current-voltage plot 300 shows critical characteristics of circuit 200.

Referring now jointly to FIGS. 2 and 3, curve 302 represents the collective leakage current effects of transistors 204, 212, and 218, while curve 304 represents the current-voltage characteristic of TD 228. Equilibrium state 306 represents the point at which the TD current equals the leakage current. TD 228 thus compensates for the leakage current; the high peak current of TD 228 holding the voltage at node 222 at a high level. Errors resulting from leakage current are thus eliminated. The present invention thus provides high stability and overall design reliability.

With the present invention, a tunneling diode structure eliminates unnecessary inverter and transistor circuitry from a pass-transistor network circuit. This results in the CMOS/TD pass-transistor logic circuit of the present invention having substantially smaller area, substantially higher speed, and substantially lower power consumption in comparison with conventional CMOS counterparts.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A pass-transistor logic device comprising:
    pass transistor circuitry implementing a Boolean condition comprising at least one pass transistor having an input terminal, an output terminal and a control gate for coupling a signal at the input terminal through the transistor and to the output terminal responsive to a signal at the control gate; and tunneling structure circuitry, coupled to said pass transistor circuitry at a node at which said Boolean condition is evaluated, to compensate a leakage current originating from said pass transistor circuitry, said tunneling structure circuitry further holding said node at a given voltage supplied by precharge circuitry.

2. The device of claim 1 wherein said device, including said tunneling structure circuitry, is fabricated in a CMOS process.

3. The device of claim 1 wherein said pass transistor circuitry further comprises a pass transistor network circuit.

4. The device of claim 1 wherein said tunneling structure circuitry is a resonant tunneling diode.

5. The device of claim 1 wherein said pre-charge circuitry comprises a transistor coupled to said node.

6. A semiconductor device performing Boolean operations, said device comprising:

pass transistor network circuitry implementing a specified Boolean condition comprising at least one pass transistor having an input terminal, an output terminal and a control gate and coupling a signal at the input terminal to the output terminal through the pass transistor responsive to a signal at the control gate; and tunneling diode circuitry, coupled to said pass transistor network circuitry at a node which said specified Boolean condition is to be evaluated, to compensate a leakage current originating from said pass transistor network circuitry and further holding said node at a given voltage supplied by pre-charge circuitry.

7. The device of claim 6 wherein said device, including said tunneling structure circuitry, is fabricated in a CMOS process.

8. The device of claim 6 wherein said tunneling diode circuitry comprises a resonant tunneling diode.

9. The device of claim 6 wherein said pre-charge circuitry comprises a transistor coupled to said node.

10. A method of producing a pass transistor logic device, said method comprising the steps of:

providing a pass transistor circuit implementing a specified Boolean condition comprising at least one pass transistor having an input terminal, an output terminal and a control gate and coupling a signal at the input to the output responsive to a signal at the control gate;

providing tunneling structure circuitry;

providing a node where said specified Boolean condition is evaluated;

providing pre-charge circuitry coupled to said node;

coupling said tunneling structure circuitry to said pass transistor circuit at said node, said tunneling structure circuitry compensating for a leakage current originating from said pass transistor circuit by holding said node at a given voltage supplied by said precharge circuitry.

11. The method of claim 10 further comprising the step of fabricating said pass transistor logic device, including said tunneling structure circuitry, in a CMOS process.

12. The method of claim 10 wherein the step of providing tunneling structure circuitry further comprises providing a resonant tunneling diode.

* * * * *